(12) United States Patent
Chen

(10) Patent No.: US 8,703,611 B1
(45) Date of Patent: Apr. 22, 2014

(54) METHOD FOR MANUFACTURING A SEMICONDUCTOR STRUCTURE

(71) Applicant: United Microelectronics Corp., Hsinchu (TW)

(72) Inventor: Ming-Kuan Chen, New Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/861,459

(22) Filed: Apr. 12, 2013

(51) Int. Cl.
*H01L 21/44* (2006.01)

(52) U.S. Cl.
USPC .......... 438/670; 438/576; 438/577; 438/578; 438/580; 438/669; 257/279; 257/346; 257/E21.025; 257/E21.453

(58) Field of Classification Search
None
See application file for complete search history.

(56) References Cited

U.S. PATENT DOCUMENTS

| | | | | | |
|---|---|---|---|---|---|
| 4,451,971 | A | * | 6/1984 | Milgram | 438/670 |
| 4,519,127 | A | * | 5/1985 | Arai | 438/181 |
| 4,519,872 | A | * | 5/1985 | Anderson et al. | 438/623 |
| 4,859,618 | A | * | 8/1989 | Shikata et al. | 438/181 |
| 5,362,677 | A | * | 11/1994 | Sakamoto et al. | 438/167 |

* cited by examiner

*Primary Examiner* — Zandra Smith
*Assistant Examiner* — Khanh Duong
(74) *Attorney, Agent, or Firm* — WPAT, PC; Justin King

(57) ABSTRACT

A method for manufacturing a semiconductor structure is disclosed. The method comprises following steps. A substrate is provided. A sacrificial layer is formed on the substrate. The sacrificial layer is patterned to develop a first opening and a second opening. The first opening corresponds to an exposed portion of the substrate and the second opening corresponds to an unexposed portion of the substrate. A heat procedure is performed. A target material is formed on the exposed portion of the substrate and a rest part of the sacrificial layer. The rest part of the sacrificial layer and parts of the target material on the rest part of the sacrificial layer are removed. A predetermined patterned target material is obtained.

18 Claims, 2 Drawing Sheets

US 8,703,611 B1

METHOD FOR MANUFACTURING A SEMICONDUCTOR STRUCTURE

BACKGROUND OF THE INVENTION

1. Field of the Invention

The invention relates in general to a method for manufacturing a semiconductor structure, and more particularly to a method for manufacturing a semiconductor structure having a predetermined patterned target material.

2. Description of the Related Art

One of the methods for creating structures of a target material on a surface of a substrate in semiconductor technology is a lift-off process. During a lift-off process, a sacrificial layer is deposited on a substrate and an inverse pattern is developed. Since the predetermined structures of target material is defined by the inverse pattern of the sacrificial layer, the accuracy and stability of the inverse pattern is critical to the formation of the predetermined structures of the target material.

SUMMARY OF THE INVENTION

The invention is directed to a method for manufacturing a semiconductor structure. By developing a second opening on a sacrificial layer and corresponding to an unexposed portion of the substrate, a predetermined patterned target material can be obtained more precisely.

According to an aspect of the present invention, a method for manufacturing a semiconductor structure is disclosed. The method comprises following steps. A substrate is provided. A sacrificial layer is formed on the substrate. The sacrificial layer is patterned to develop a first opening and a second opening. The first opening corresponds to an exposed portion of the substrate and the second opening corresponds to an unexposed portion of the substrate. A heat procedure is performed. A target material is formed on the exposed portion of the substrate and a rest part of the sacrificial layer. The rest part of the sacrificial layer and parts of the target material on the rest part of the sacrificial layer are removed. A predetermined patterned target material is obtained.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
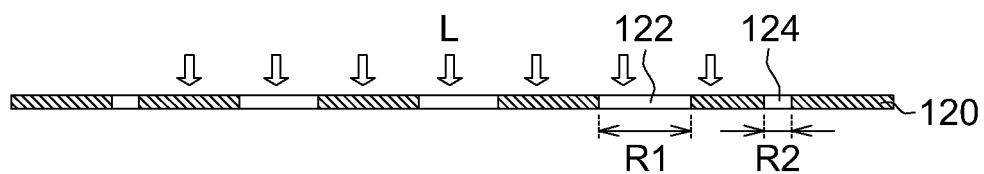
FIGS. 1-4 are cross-sectional views showing a process flow of a method for manufacturing a semiconductor structure according to one embodiment of the invention.
Figure 2:
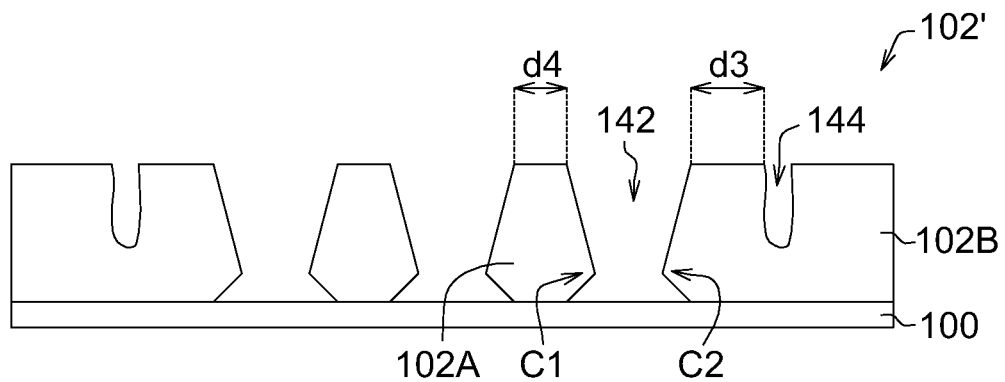
Figure 3:
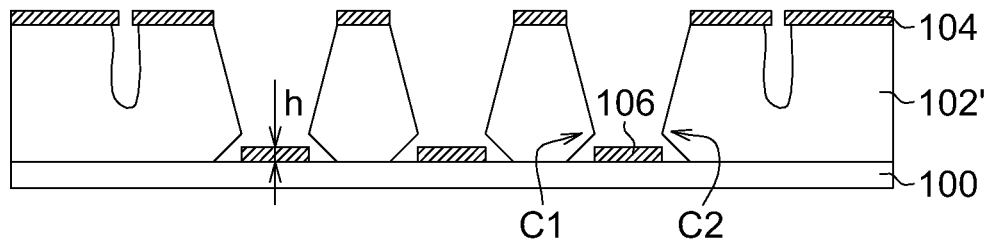
Figure 4:
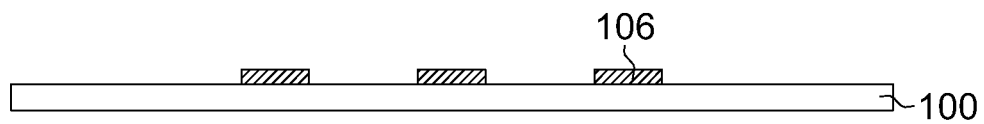

FIGS. 1-4 are cross-sectional views showing a process flow of a method for manufacturing a semiconductor structure according to one embodiment of the invention. The process flow illustrated in FIGS. 1-4 is for example a lift-off process. FIGS. 1-2 illustrate a process of patterning the sacrificial layer according to an embodiment of the invention. FIGS. 3-4 illustrate a process of forming a predetermined patterned target material according to an embodiment of the invention.

Please referring to FIG. 1, a substrate 100 is provided. A sacrificial layer 102 is formed on the substrate 100. The sacrificial layer 102 can be a photoresist layer or other photosensitive material layer. A mask 120 is disposed on the sacrificial layer 102. An exposure process is performed to the sacrificial layer 102 though the mask 120. The light source L to be used in the exposure process can be I-line, which has a wavelength of about 365 nm, and the invention is not limited thereto.

The mask 120 can comprises a substantial pattern 122 and a dummy pattern 124. A dimension R2 of the dummy pattern 124 is smaller than a dimension R1 of the substantial pattern 122. In particular, the dimension R2 of the dummy pattern 124 is smaller than a minimum resolution of the photoresist layer (such as a photoresist layer), so that patterns defined by the dummy pattern 124 will not penetrate through the sacrificial layer 102.

After the exposure process, the sacrificial layer 102 has a plurality of light exposure parts and light shielding parts arranged alternately. Then, a heat procedure, such as a post exposure bake (PEB) procedure, can be performed to the sacrificial layer 102. The post exposure bake procedure can be performed at about 100° Celsius (C.)~120° C. for about 1 minute.

If the sacrificial layer 102 is a positive photoresist, the light shielding parts of the sacrificial layer 102 will be left over after the development process. The light shielded patterns defined by the mask 120 comprise areas with different sizes. The large area and the small area of the light shielding parts may have different thermal contraction effect (such as a cohesion force effect) after the PEB procedure. By designing the dummy pattern 124 on the mask, the non-penetrating patterns defined by the dummy pattern 124 can incise the large area of light shielded sacrificial layer 102 into smaller areas. Therefore, the incised large area of the light shielded sacrificial layer 102 can have similar thermal contraction effect with the small area of the light shielded sacrificial layer 102.

In this case, the sacrificial layer 102 is for example a positive photoresist layer, and the invention is not limited thereto. In other embodiments, the sacrificial layer 102 can be a negative photoresist layer. If the sacrificial layer 102 is a negative photoresist layer, the light transmitting pattern of the mask (not shown) will be reverse from the mask 120 in FIG. 1. The light shielded patterns on the sacrificial layer 102 defined by the dummy pattern (not shown) is used for incising the large area of exposed sacrificial layer 102 into smaller areas. Therefore, the incised large area of the exposed sacrificial layer 102 can have similar thermal contraction effect with other small areas of the exposed sacrificial layer 102 after the PEB procedure.

Referring to FIG. 2, the developing process is performed to develop a patterned sacrificial layer 102'. The light exposure parts of the sacrificial layer 102 (illustrated in FIG. 1) are removed by a developer. Then, the sacrificial layer 102 having a first opening 142 and a second opening 144 can be formed. The first opening 142 corresponds to an exposed portion of the substrate 100 and the second opening 144 corresponds to an unexposed portion of the substrate 100. Besides, the first opening 142 corresponds to the substantial pattern 122 on the mask 120 (shown in FIG. 1) and the second opening 144 corresponds to the dummy pattern 124 on the mask 120 (shown in FIG. 1), and the dimension R2 of the dummy pattern 124 is smaller than the dimension R1 of the substantial pattern 122.

The patterned sacrificial layer 102' comprises a first area 102A and a second area 102B. The first opening 142 is located between the first area 102A and the second area 102B. The second opening 144 is located on the second area 102B. A width of the second area 102B is at least two times (such as 2~3 times) larger than a width of the first area 102A. The second opening 144 can be a non-penetrating opening.

As shown in FIG. 2, a section structure of the first area 102A is a polygon structure having a corner portion C1. A section structure of a second area 102B is for example a polygon structure with a corner portion C2 and a second opening 144 (non-penetrating opening), and the invention is not limited thereto. A distance d3 between the second opening 144 (non-penetrating opening) and the first opening 142 is about 0.5~5 times larger than a width d4 of the first area 102A. In one embodiment, the distance d3 is substantially equal to the width d4.

Figures 5A, 5B:
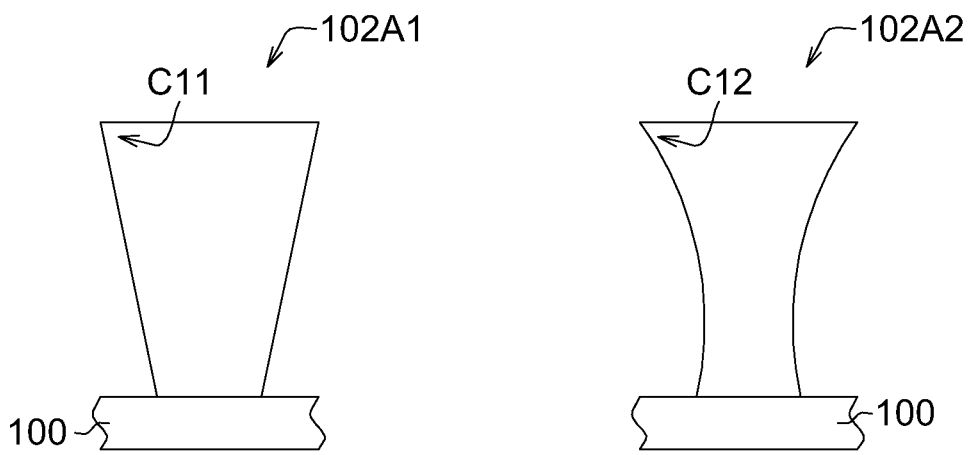
FIGS. 5A-5B illustrate different types of first area according to other embodiments of the invention.

FIGS. 5A-5B illustrate different types of first area according to other embodiments of the invention. Referring to FIG. 5A-5B, a first area 102A1 and a first area 102A2 are first areas formed by different type of sacrificial layers (i.e. different type of photoresist) according to other example embodiments of the invention. The section structure of the first area 102A1 can be a trapezoid structure with a corner portion C11, and the first area 102A2 can be an approximate trapezoid with a curve edge and with a corner portion C12.

Similarly, the section structure of the second area 102B can also be a trapezoid structure with the corner portion and the non-penetrating opening, or an approximate trapezoid with a curve edge, the corner portion and the non-penetrating opening. The structure shapes of the first area 102A and the second area 102B are related to the characteristics of the sacrificial layer 102, and the structure shape of the first areas is not limited to the illustrated drawings.

In one embodiment, a hard bake procedure can be selectively performed after the developing process. Since the hard bake procedure is a heat procedure, the patterned sacrificial layer 102' needs to endure the heat generated by the hard bake procedure. A non-penetrating opening (second opening 144) is formed on the second area 102B (larger area) to incise the second area 102B into smaller sections, thereby the thermal contraction effect (such as a cohesion force effect) of the corner portion C2 can be adjusted. Therefore, even if the patterned sacrificial layer 102' undergoes a heat process, the profile of the corner portion C1 and corner portion C2 can be substantially symmetrical by forming the second opening 144 on the second area 102B.

Referring to FIG. 3, a target material 104 and a target material 106 are formed on patterned sacrificial layer 102' (a rest part of the sacrificial layer 102) and on the exposed portion of the substrate 100 respectively.

The target material 104 and the target material 106 are formed simultaneously by the same material, such as metal. The target material 104 and the target material 106 can be selected from a group consisting of Au, Cu, Pt and alloys thereof. A height of the target material 106 is smaller than a height of the corner portion C1 and a height of the corner portion C2. In one embodiment, the target material 104 and the target material 106 can be formed by a sputtering process or an electron gun evaporation process.

The sputtering process or the electron gun evaporation process is heat procedures. During the step of forming the target material 104 and the target material 106, the patterned sacrificial layer 102' need to endure the heat generated by the sputtering process or the electron gun evaporation process. Since the non-penetrating opening (second opening 144) is formed on the second area 102B (larger area) of the patterned sacrificial layer 102', the profile of the corner portion C1 and corner portion C2 can be adjusted to be substantially symmetrical.

Referring to FIG. 4, the patterned sacrificial layer 102' (shown in FIG. 3) and parts of the target material 104 on the patterned sacrificial layer 102' (rest part of the sacrificial layer 102) are removed. The residue pattern is the target material 106. A predetermined patterned target material (the same as the target material 106) is obtained.

Based on the above, the method for manufacturing a semiconductor structure (predetermined patterned target material) according to the embodiments of the invention is disclosed. Since a predetermined patterned target material is defined by the sacrificial layer, the stability of the sacrificial layer is critical to the process. The embodiments teach the use of forming a second opening corresponding to an unexposed portion of the substrate, in order to adjust the thermal contraction effect of the sacrificial layer during the heat procedure. In one embodiment, the second opening is formed on the larger area of the patterned sacrificial layer; thereby the profile of the patterned sacrificial layer can be improved even when the patterned sacrificial layer undergoes a heat procedure. Therefore, an ideal predetermined patterned target material can be obtained according to the embodiments of the invention.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor structure, comprising:
   providing a substrate;
   forming a sacrificial layer on the substrate;
   patterning the sacrificial layer to form a first opening and a second opening, wherein the first opening penetrates the sacrificial layer and corresponds to an exposed portion of the substrate and the second opening locates in the sacrificial layer and corresponds to an unexposed portion of the substrate;
   performing a heat procedure;
   forming a target material on the exposed portion of the substrate and a rest part of the sacrificial layer;
   removing the rest part of the sacrificial layer together with parts of the target material on the rest part of the sacrificial layer; and
   obtaining a predetermined patterned target material.

2. The method according to claim 1, wherein the target material to be formed is metal.

3. The method according to claim 2, wherein the target material to be formed is selected from a group consisting of Au, Cu, Pt and alloys thereof.

4. The method according to claim 1, wherein the target material is formed by a sputtering process or an electron gun evaporation process.

5. The method according to claim 1, wherein the heating procedure comprises at least one of a post exposure bake procedure, a hard bake procedure, a sputtering procedure and the electron gun evaporation procedure.

6. The method according to claim 5, wherein the step of patterning the sacrificial layer comprises:
   disposing a mask on the sacrificial layer;
   performing an exposure process to the sacrificial layer through the mask;
   performing the post exposure bake procedure to the sacrificial layer; and
   performing the developing process to develop a patterned sacrificial layer.

7. The method according to claim 5, wherein the target material is formed by the sputtering procedure or the electron gun evaporation procedure.

8. The method according to claim 1, wherein the heat procedure is occurred during the step of forming the target material.

9. The method according to claim 1, wherein the step of patterning the sacrificial layer comprises:

disposing a mask on the sacrificial layer, wherein the mask comprises a dummy pattern and a substantial pattern; and performing a photolithography process to a develop a patterned sacrificial layer, wherein the patterned sacrificial layer comprises the first opening and the second opening, the first opening corresponds to the substantial pattern on the mask and the second opening corresponds to the dummy pattern on the mask, and a dimension of the dummy pattern is smaller than a dimension of the substantial pattern.

10. The method according to claim 9, wherein the sacrificial layer is a photoresist layer, and the dimension of the dummy pattern is smaller than a minimum resolution of the photoresist layer.

11. The method according to claim 10, wherein the photoresist layer is a negative photoresist or a positive photoresist.

12. The method according to claim 9, wherein the patterned sacrificial layer comprises a first area and a second area, a width of the second area is at least two times larger than a width of the first area.

13. The method according to claim 12, wherein a section structure of a first area is a polygon structure, a trapezoid structure, or an approximate trapezoid with a curve edge.

14. The method according to claim 1, wherein the second opening is a non-penetrating opening.

15. The method according to claim 14, wherein the patterned sacrificial layer comprises a first area and a second area, a section structure of a second area is a polygon structure with the non-penetrating opening, a trapezoid structure with the non-penetrating opening, or an approximate trapezoid with a curve edge and the non-penetrating opening.

16. The method according to claim 14, wherein the patterned sacrificial layer comprises a first area and a second area, the first opening is between the first area and the second area, and a distance between the non-penetrating opening and the first opening is 0.5~5 times larger than a width of the first area.

17. The method according to claim 16, wherein the distance is substantially equal to the width of the first area.

18. The method according to claim 1, wherein the predetermined patterned target material is formed by a lift-off process.

* * * * *